United States Patent
Asano et al.

(10) Patent No.: US 8,993,367 B2
(45) Date of Patent: Mar. 31, 2015

(54) METHOD FOR PRODUCING CELL FOR LIGHT-EMITTING DEVICE AND METHOD FOR PRODUCING LIGHT-EMITTING DEVICE

(75) Inventors: Hideki Asano, Otsu (JP); Masanori Wada, Otsu (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 0 days.

(21) Appl. No.: 14/128,637

(22) PCT Filed: May 24, 2012

(86) PCT No.: PCT/JP2012/063318
§ 371 (c)(1),
(2), (4) Date: Dec. 23, 2013

(87) PCT Pub. No.: WO2013/005493
PCT Pub. Date: Jan. 10, 2013

(65) Prior Publication Data
US 2014/0162387 A1    Jun. 12, 2014

(30) Foreign Application Priority Data

Jul. 1, 2011 (JP) ................................. 2011-147329

(51) Int. Cl.
*H01L 21/00* (2006.01)
*H01L 33/50* (2010.01)
(Continued)

(52) U.S. Cl.
CPC .............. *H01L 33/50* (2013.01); *C03B 23/203* (2013.01); *C03C 27/06* (2013.01); *H01L 33/505* (2013.01);
(Continued)

(58) Field of Classification Search
CPC ..... H01L 33/005; H01L 33/50; H01L 33/505; H01L 33/507
USPC .......................... 438/29, 89, 69, 72, 458, 462
See application file for complete search history.

(56) References Cited

U.S. PATENT DOCUMENTS

| 8,568,184 B2 * | 10/2013 | Prest et al. ...................... 445/25 |
| 2004/0257797 A1 | 12/2004 | Suehiro et al. |
| 2010/0270919 A1 * | 10/2010 | Hubert et al. ................. 313/512 |

FOREIGN PATENT DOCUMENTS

| JP | 2005-093681 A | 4/2005 |
| JP | 2008-041626 A | 2/2008 |

(Continued)

OTHER PUBLICATIONS

Official Communication issued in International Patent Application No. PCT/JP2012/063318, mailed on Jun. 26, 2012.
English translation of Official Communication issued in corresponding International Application PCT/JP2012/063318, mailed on Jan. 16, 2014.

*Primary Examiner* — Michelle Mandala
(74) *Attorney, Agent, or Firm* — Keating & Bennett, LLP

(57) ABSTRACT

Provided is a method whereby a cell for a light-emitting device less variable in the thickness of the internal space can be suitably produced with high production efficiency. A glass-made fused part forming element (25) is provided in a grid-like pattern between a pair of glass sheet base materials (21, 24) disposed facing each other with a space therebetween. The fused part forming element (25) is fused to each of the pair of glass sheet base materials (21, 24) to produce a cell base material (30) having a grid-like fused part (26). The cell base material (30) is cut along each of row and column directions of the grid-like fused part (26) to produce a plurality of light-emitting devices (1). Portions off the grid-like fused part forming element (25) along a first direction are formed of glass ribbons (22) and portions of the grid-like fused part forming element (25) along a second direction are formed of glass paste.

7 Claims, 6 Drawing Sheets

(51) Int. Cl.
  *C03B 23/203* (2006.01)
  *C03C 27/06* (2006.01)
  *H01L 33/00* (2010.01)
  *C09K 11/88* (2006.01)

(52) U.S. Cl.
  CPC ....... *H01L 33/507* (2013.01); *H01L 2933/0041* (2013.01); *H01L 33/005* (2013.01); *C09K 11/883* (2013.01); *H01L 2924/0002* (2013.01)
  USPC .......................................... 438/69

(56) References Cited

FOREIGN PATENT DOCUMENTS

| | | |
|---|---|---|
| JP | 2008-108835 A | 5/2008 |
| JP | 2010-533976 A | 10/2010 |
| WO | 2009/011922 A1 | 1/2009 |

* cited by examiner

METHOD FOR PRODUCING CELL FOR LIGHT-EMITTING DEVICE AND METHOD FOR PRODUCING LIGHT-EMITTING DEVICE

TECHNICAL FIELD

This invention relates to a method for producing a cell for a light-emitting device and a method for producing a light-emitting device.

BACKGROUND ART

Light-emitting devices have heretofore been known in which a luminescent material, such as quantum dot or phosphor, is used (see, for example, Patent Literature 1). In such a light-emitting device, generally, the luminescent material is encapsulated in a cell.

CITATION LIST

Patent Literature

Patent Literature 1: JP-A-2010-533976

SUMMARY OF INVENTION

Technical Problem

The luminescence intensity of the light-emitting device correlates with the thickness of an internal space formed in the cell in order to encapsulate the luminescent material therein. Specifically, the luminescence intensity of the light-emitting device increases as the internal space of the cell increases in thickness. Therefore, from the viewpoint of reducing variations in the luminescence intensity of the light-emitting device, it is necessary to reduce variations in the thickness of the internal space of the cell for the light-emitting device.

The present invention has been made in view of the above point and an object thereof is to provide a method whereby a cell for a light-emitting device less variable in the thickness of the internal space can be suitably produced with high production efficiency.

Solution to Problem

A method for producing a cell for a light-emitting device according to the present invention pertains to a method for producing a cell for a light-emitting device including a pair of glass sheets disposed facing each other with a space therebetween and a glass-made fused part disposed between respective peripheral portions of the pair of glass sheets and fused to each of the pair of glass sheets. In the method for producing a cell for a light-emitting device according to the present invention, a glass-made fused part forming element is provided in a grid-like pattern between a pair of glass sheet base materials disposed facing each other with a space therebetween. The fused part forming element is fused to each of the pair of glass sheet base materials to produce a cell base material having a grid-like fused part. The cell base material is cut along each of row and column directions of the grid-like fused part to produce a plurality of light-emitting devices. Portions of the grid-like fused part forming element extending along a first direction are formed of glass ribbons and portions of the grid-like fused part forming element extending along a second direction are formed of glass paste.

The fused part forming element may be formed by arranging the glass ribbons along the first direction on one of the pair of glass sheet base materials and applying the glass paste along the second direction on the one glass sheet base material.

The glass paste may also be applied on the glass ribbons.

The glass paste may be kept from being applied on the glass ribbons.

In a method for producing a light-emitting device according to the present invention, a plurality of cells for light-emitting devices are produced by the above method for producing a cell for a light-emitting device according to the present invention. A luminescent material is injected into each of the plurality of cells for light-emitting devices.

The preferred luminescent material for use is formed of an inorganic phosphor. The preferred inorganic phosphor for use is quantum dot.

Advantageous Effects of Invention

The present invention can provide a method whereby a cell for a light-emitting device less variable in the thickness of the internal space can be suitably produced with high production efficiency.

DESCRIPTION OF EMBODIMENTS

Figure 1:
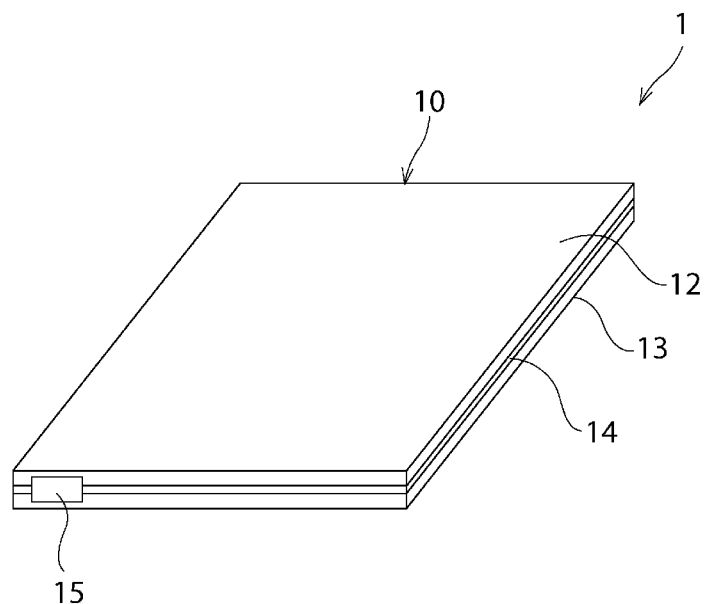
FIG. 1 is a schematic perspective view of a light-emitting device produced in a first embodiment.

Hereinafter, a description will be given of an example of a preferred embodiment for working of the present invention. However, the following embodiments are simply illustrative. The present invention is not at all limited to the following embodiments.

Throughout the drawings to which the embodiments and the like refer, elements having substantially the same functions will be referred to by the same reference signs. The drawings to which the embodiments and the like refer are schematically illustrated, and the dimensional ratios and the like of objects illustrated in the drawings may be different from those of the actual objects. Different drawings may have different dimensional ratios and the like of the objects.

Dimensional ratios and the like of specific objects should be determined in consideration of the following descriptions.

(First Embodiment)

(Structure of Light-Emitting Device 1)

Figure 2:
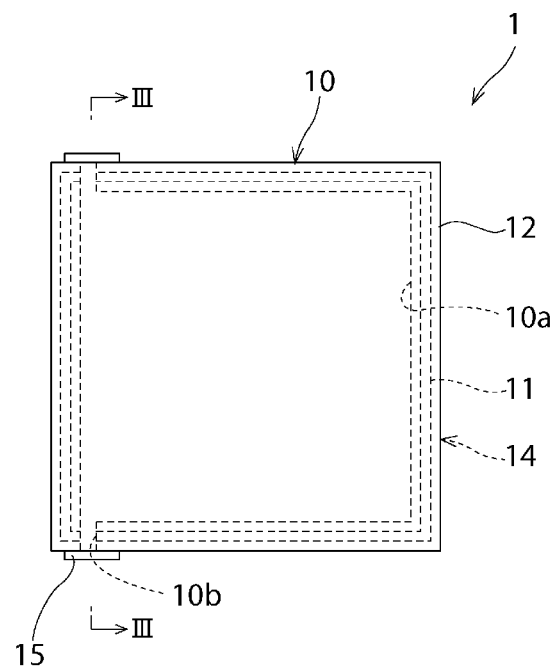
FIG. 2 is a schematic plan view of the light-emitting device produced in the first embodiment.
Figure 3:
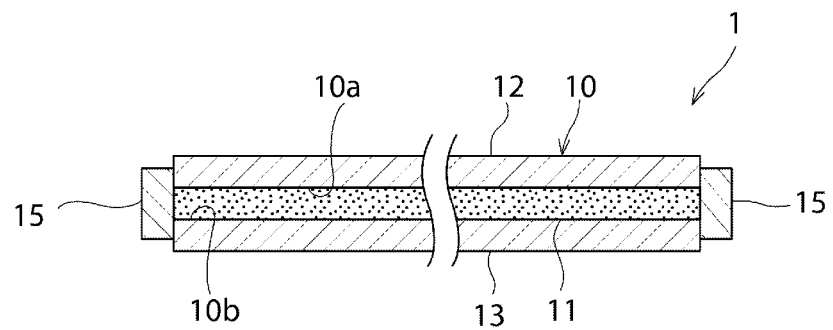
FIG. 3 is a schematic cross-sectional view taken along the line III-III in FIG. 2.

FIG. 1 is a schematic perspective view of a light-emitting device produced in a first embodiment. FIG. 2 is a schematic plan view of the light-emitting device produced in the first embodiment. FIG. 3 is a schematic cross-sectional view taken along the line III-III in FIG. 2.

First with reference to FIGS. 1 to 3, the structure of a light-emitting device produced in this embodiment is described.

The light-emitting device 1 is a device configured to, upon incidence of excitation light, emit light having a different wavelength from that of the excitation light. The light-emitting device 1 may be a device configured to transmit part of excitation light and emit mixed light of the excitation light and light produced by irradiation with the excitation light.

The light-emitting device 1 includes a cell 10. As shown in FIGS. 2 and 3, the cell 10 has an internal space 10a. A luminescent material 11 is encapsulated in the internal space 10a. Specifically, encapsulated in the internal space 10a is a luminescent material 11 in which a luminescent substance is dispersed in a dispersion medium.

No particular limitation is placed on the type of the luminescent material. Examples of the luminescent substance include phosphors, such as, for example, inorganic phosphors and organic phosphors. Of these phosphors, the preferred are inorganic phosphors.

Specific examples of the inorganic phosphor which produces a blue visible light (fluorescence having a wavelength of 440 nm to 480 nm) upon irradiation with an ultraviolet to near-ultraviolet excitation light having a wavelength of 300 to 440 nm include $Sr_5(PO_4)_3Cl:Eu^{2+}$ and $(Sr,Ba)MgAl_{10}O_{17}:Eu^{2+}$. Specific examples of the inorganic phosphor which produces a green fluorescence (fluorescence having a wavelength of 500 nm to 540 nm) upon irradiation with an ultraviolet to near-ultraviolet excitation light having a wavelength of 300 to 440 nm include $SrAl_2O_4:Eu^{2+}$ and $SrGa_2S_4:Eu^{2+}$. Specific examples of the inorganic phosphor which produces a green visible light (fluorescence having a wavelength of 500 nm to 540 nm) upon irradiation with a blue excitation light having a wavelength of 440 to 480 nm include $SrAl_2O_4:Eu^{2+}$ and $SrGa_2S_4:Eu^{2+}$. A specific example of the inorganic phosphor which produces a yellow visible light (fluorescence having a wavelength of 540 nm to 595 nm) upon irradiation with an ultraviolet to near-ultraviolet excitation light having a wavelength of 300 to 440 nm is $ZnS:Eu^{2+}$. A specific example of the inorganic phosphor which produces a yellow visible light (fluorescence having a wavelength of 540 nm to 595 nm) upon irradiation with a blue excitation light having a wavelength of 440 to 480 nm is $Y_3(Al,Gd)_5O_{12}:Ce^{2+}$. Specific examples of the inorganic phosphor which produces a red visible light (fluorescence having a wavelength of 600 nm to 700 nm) upon irradiation with an ultraviolet to near-ultraviolet excitation light having a wavelength of 300 to 440 nm include $Gd_3Ga_4O_{12}:Cr^{3+}$ and $CaGa_2S_4:Mn^{2+}$. Specific examples of the inorganic phosphor which produces a red visible light (fluorescence having a wavelength of 600 nm to 700 nm) upon irradiation with a blue excitation light having a wavelength of 440 to 480 nm include $Mg_2TiO_4:Mn^{4+}$ and $K_2SiF_6:Mn^{4+}$. The inorganic phosphors that can be used are those having a particle size of about 5 μm to about 50 μm.

Alternatively, the inorganic phosphor may be quantum dot. The quantum dot emits, upon incidence of excitation light, light having a different wavelength from that of the excitation light. The wavelength of light emitted from the quantum dot depends upon the particle size of the quantum dot. In other words, by changing the particle size of the quantum dot, the wavelength of light to be obtained can be controlled. Therefore, the particle size of the quantum dot is selected to be a particle size meeting a desired wavelength of light. The quantum dot is generally less likely to be degraded by the contact with oxygen.

Examples of the quantum dot that can be used include those having a particle size of about 2 nm to about 10 nm. Specific examples of the quantum dot which produces a blue visible light (fluorescence having a wavelength of 440 nm to 480 nm) upon irradiation with an ultraviolet to near-ultraviolet excitation light having a wavelength of 300 to 440 nm include CdSe nanocrystals having a particle size of about 2.0 nm to about 3.0 nm. Specific examples of the quantum dot which produces a green visible light (fluorescence having a wavelength of 500 nm to 540 nm) upon irradiation with an ultraviolet to near-ultraviolet excitation light having a wavelength of 300 to 440 nm or a blue light having a wavelength of 440 to 480 nm include CdSe nanocrystals having a particle size of about 3.0 nm to about 3.3 nm. Specific examples of the quantum dot which produces a yellow visible light (fluorescence having a wavelength of 540 nm to 595 nm) upon irradiation with an ultraviolet to near-ultraviolet excitation light having a wavelength of 300 to 440 nm or a blue light having a wavelength of 440 to 480 nm include CdSe nanocrystals having a particle size of about 3.3 nm to about 4.5 nm. Specific examples of the quantum dot which produces a red visible light (fluorescence having a wavelength of 600 nm to 700 nm) upon irradiation with an ultraviolet to near-ultraviolet excitation light having a wavelength of 300 to 440 nm or a blue light having a wavelength of 440 to 480 nm include CdSe nanocrystals having a particle size of about 4.5 nm to about 10 nm.

A single type or a plurality of types of luminescent substances may be encapsulated in the internal space 10a depending upon the wavelength range of the excitation light and which color luminescence to be produced. For example, if a white light having superior color rendition is to be produced by irradiation with an ultraviolet to near-ultraviolet excitation light, respective luminescent substances capable of producing blue, green, and red visible lights (fluorescences) by irradiation with the ultraviolet to near-ultraviolet excitation light can be used in combination. Alternatively, if a white light having superior color rendition is to be produced by irradiation with a blue excitation light, respective luminescent substances capable of producing green and red visible lights (fluorescences) by irradiation with the blue excitation light can be used in combination.

No particular limitation is placed on the type of the dispersion medium so long as it can suitably disperse the luminescent substance. The dispersion medium may be in liquid form or may be made of resin, glass or other materials.

As shown in FIG. 3, the cell 10 includes a pair of glass sheets 12 and 13. The pair of glass sheets 12 and 13 are disposed facing each other with a space therebetween. The glass sheet 12 and the glass sheet 13 are parallel to each other. It is not always necessary that both the glass sheets 12 and 13 transmit both of excitation light and luminescence of the luminescent substance contained in the luminescent material 11 encapsulated in the internal space 10a. However, at least one of the glass sheets 12 and 13 needs to transmit luminescence of the luminescent substance and at least one of them needs to transmit excitation light of the luminescent substance. For example, the glass sheet 12 may transmit excitation light, whereas the glass sheet 13 may transmit luminescence.

The glass sheets 12 and 13 are preferably those having superior weatherability and less likely to react with the quantum dot and the dispersion medium. The glass sheets 12 and 13 can be made of, for example, silicate glass. The glass sheets 12 and 13 may be crystallized glass sheets.

No particular limitation is placed on the thickness of the glass sheets 12 and 13 but the thickness can be, for example, about 0.5 to about 2.0 mm.

A glass-made fused part 14 (not shown) is disposed between respective peripheral portions of the glass sheets 12 and 13. This fused part 14 is fused to each of the glass sheets 12 and 13. The fused part 14 and the glass sheets 12 and 13 define the internal space 10a for encapsulating the luminescent material 11 therein.

The luminescent material 11 is encapsulated into the internal space 10a through a communication hole 10b which is formed in the cell 10 and communicated with the internal space 10a. The communication hole 10b is sealed by a sealing member 15.

(Method for Producing Light-Emitting Device 1)

Figure 4:
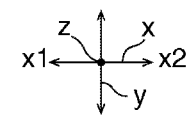
FIG. 4 is a schematic plan view for illustrating a step for producing the cell for a light-emitting device in the first embodiment.
Figure 4:
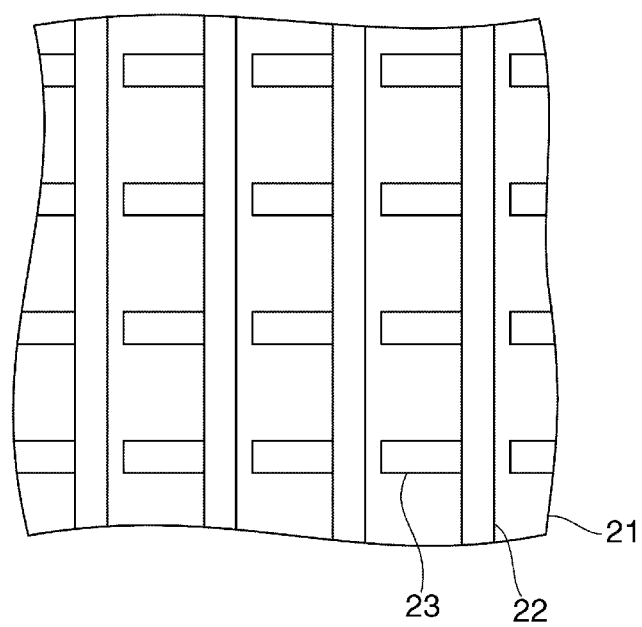
Figure 5:
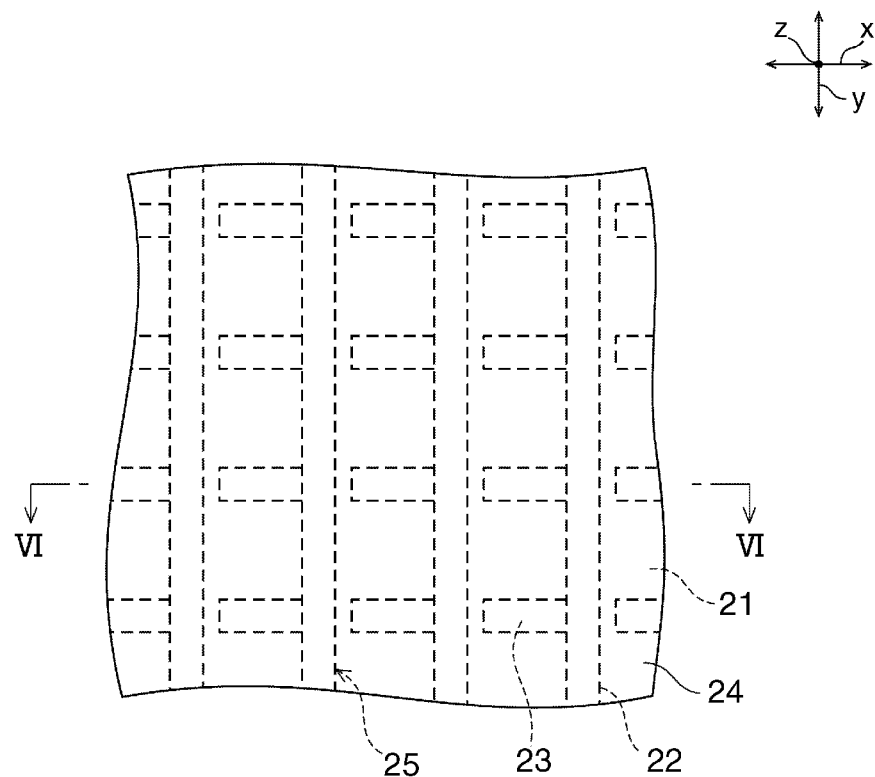
FIG. 5 is a schematic plan view for illustrating another step for producing the cell for a light-emitting device in the first embodiment.
Figure 6:
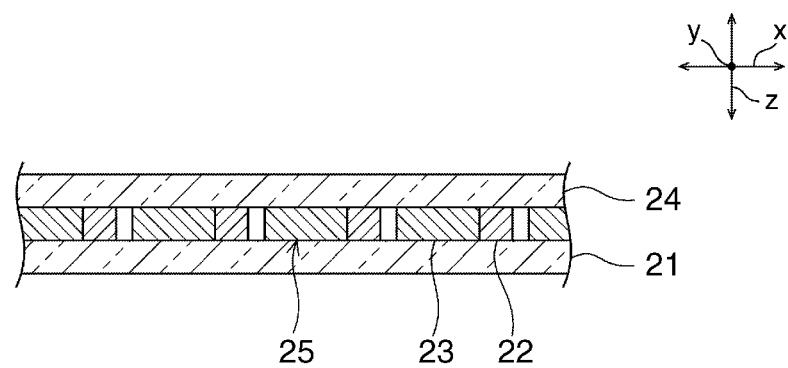
FIG. 6 is a schematic cross-sectional view taken along the line VI-VI in FIG. 5.
Figure 7:
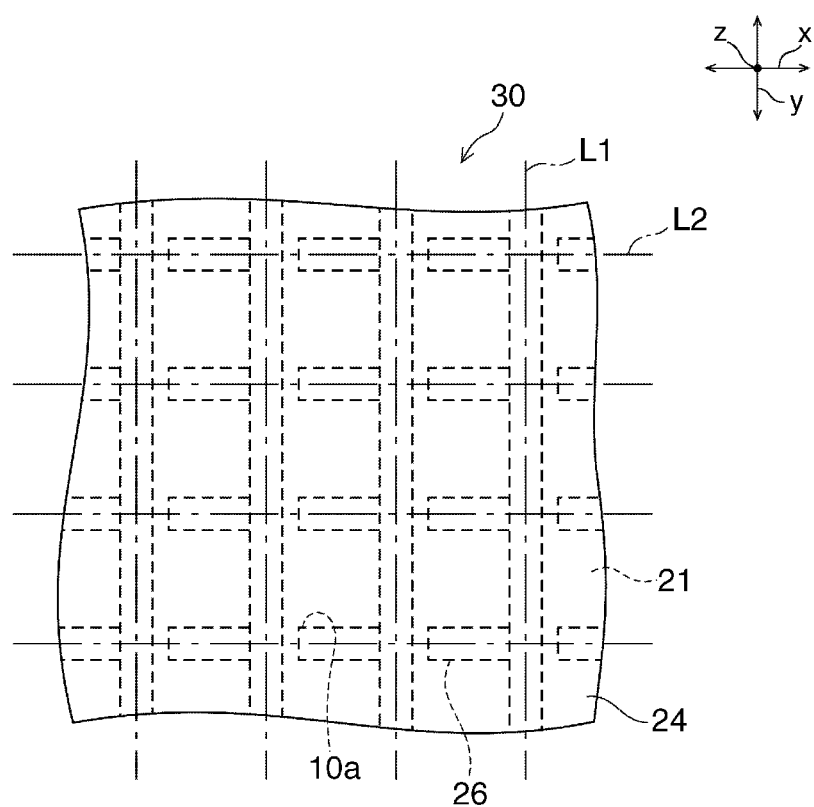
FIG. 7 is a schematic plan view for illustrating still another step for producing the cell for a light-emitting device in the first embodiment.

FIGS. 4, 5, and 7 are schematic plan views for illustrating steps for producing the cell for a light-emitting device in the first embodiment. FIG. 6 is a schematic cross-sectional view taken along the line VI-VI in FIG. 5.

Next, a description will be given of a method for producing the light-emitting device 1 with reference mainly to FIGS. 4 to 7.

First, two glass sheet base materials 21 and 24 (see, for example, FIG. 6) are prepared. These glass sheet base materials 21 and 24 are those for forming a plurality of glass sheets 12 and 13.

Next, as shown in FIG. 4, glass ribbons 22 are arranged on the glass sheet base material 21 and glass paste is printed on the glass sheet base material 21 to form glass paste layers 23. Specifically, a plurality of glass ribbons 22 extending along a direction y are arranged at regular intervals in a direction x perpendicular to the direction y. Meanwhile, a plurality of glass paste layers 23 extending along the direction x are arranged to surround spaces in collaboration with the glass ribbons 22. In this embodiment, the glass paste is not applied on the glass ribbons 22, so that the glass paste layers 23 are provided to avoid lying on the glass ribbons 22. In addition, a clearance for forming a communication hole 10b is created between an end of each glass paste layer 23 located on the x1 side thereof and the adjacent glass ribbon 22.

The materials for the glass ribbons that can be used are glasses, including silicate glasses, borosilicate glasses, soda-lime glasses, alkali-free glasses, and crystallized glasses. Furthermore, they may be made of a glass of different type from that of the glass sheets 12 and 13 but is preferably made of a glass of the same type as that of the glass sheets 12 and 13. Thus, the glass sheets 12 and 13 can be equal in coefficient of thermal expansion to the glass ribbons. Therefore, the deformation of the cell 10 upon application of heat can be reduced.

No particular limitation is placed on the type of the glass paste for use in forming the glass paste layers 23 so long as it contains glass powder. The glass paste contains glass powder of tin phosphate glass, bismuth-based glass or the like. The glass powder may contain a light-absorbing material. In addition to the glass powder, the glass paste may contain a solvent and ceramic powder of alumina, titania, zirconia or the like. In addition to the glass powder, the glass paste may contain a solvent, ceramic powder, and other materials.

Next, as shown in FIGS. 5 and 6, a glass sheet base material 24 is placed over the glass sheet base material 21 with the glass ribbons 22 and the glass paste layers 23 in between.

As the result of the above steps, a grid-like fused part forming element 25 composed of the glass ribbons 22 and the glass paste layers 23 is placed between a pair of the glass sheet base materials 21 and 24 disposed facing each other with a space therebetween. The portions of the grid-like fused part forming element 25 extending along the direction y are formed of the glass ribbons 22, while the portions thereof extending along the direction x are formed of the glass paste layers 23 made of glass paste.

Next, at least one of each glass sheet base material 21, 24 and the fused part forming element 25 is heated, such as by irradiation with laser light, so that each of the glass sheet base materials 21 and 24 is fused to the fused part forming element 25. Thus, as shown in FIG. 7, a cell base material 30 is produced which is composed of a grid-like fused part 26 and the glass sheet base materials 21 and 24 and includes a plurality of internal spaces 10a.

The portions of the fused part forming element 25 formed of the glass ribbons 22 may be entirely fused to the glass sheet base materials 21 and 24 or may be only partly fused to them. If the portions of the fused part forming element 25 formed of the glass ribbons 22 are only partly fused to the glass sheet base materials 21 and 24, the remaining portions of the glass ribbons 22 not fused to them function as a spacer. Therefore, the thickness of the internal spaces 10a can be more accurately controlled.

Next, the cell base material 30 is cut along cutting lines L1 and L2 which extend along the directions y and x corresponding to column and row directions, respectively, of the fused part 26 and pass through the portions of the cell base material 30 provided with the fused part 26. Thus, a plurality of cells 10 shown in FIGS. 1 to 3 are produced. The cutting of the cell base material 30 can be implemented, for example, using a diamond cutter or by dicing. The cutting of the cell base material 30 in this embodiment is particularly preferably implemented by dicing.

Next, a luminescent material 11 is injected into the internal space 10a of each of the plurality of produced cells 10 and the internal space 10a is then sealed by a sealing member 15 to encapsulate the luminescent material 11. The injection of the luminescent material 11 can be performed, for example, by sealing one of the two communication holes 10b with a sealing member 15 and then supplying, with the internal space 10a in a pressure-reduced atmosphere, a liquid containing the luminescent material 11 dispersed therein to the internal space 10a.

As seen from the above, in this embodiment, a plurality of cells 10 for light-emitting devices can be concurrently produced. Therefore, a large number of light-emitting devices 1 can be efficiently produced.

It is also conceivable that in producing cells for light-emitting devices, a plurality of glass ribbons extending along the direction x are arranged in the direction y and a plurality of glass ribbons extending along the direction y are arranged in the direction x to thereby form a fused part forming element of glass ribbons only. In this case, however, overlapping portions of the glass ribbons extending along the direction x and the glass ribbons extending along the direction y have a greater thickness than portions formed only of the glass ribbons extending along the direction x or portions formed only of the glass ribbons extending along the direction y. Therefore, variations in the thickness of each internal space 10a and deformation of the glass sheet base materials 21 and 24 may occur.

Unlike the above case, in this embodiment, the portions of the fused part forming element 25 extending along the direction y are formed of glass ribbons 22 and the portions thereof extending along the direction x are formed of glass paste. Therefore, variations in the thickness of the fused part forming element 25 can be reduced. Thus, variations in the thickness of each internal space 10a can be reduced. As a result, in-plane variations in the luminescence intensity of the light-emitting device 1 to be produced can be reduced.

Hence, by following the production method of this embodiment, a light-emitting device less variable in luminescence intensity can be suitably produced with high production efficiency.

From the viewpoint of reducing variations in the thickness of the internal space 10a, it is more preferred, as in this embodiment, to avoid applying glass paste on the glass ribbons 22. However, the present invention is not limited to this. The glass paste may be applied on the glass ribbons 22. Even in this case, because of high fluidity and ease of deformation of the glass paste layers 23, a fused part forming element 25 less variable in thickness can be obtained. Therefore, even if glass paste is also applied on the glass ribbons 22, variations in the thickness of each internal space 10a can be reduced.

Hereinafter, a description will be given of another example of a preferred embodiment of the present invention. In the following description, elements having substantially the same functions as those in the first embodiment are referred to by the common references and further explanation thereof will be omitted.

(Second Embodiment)

Figure 8:
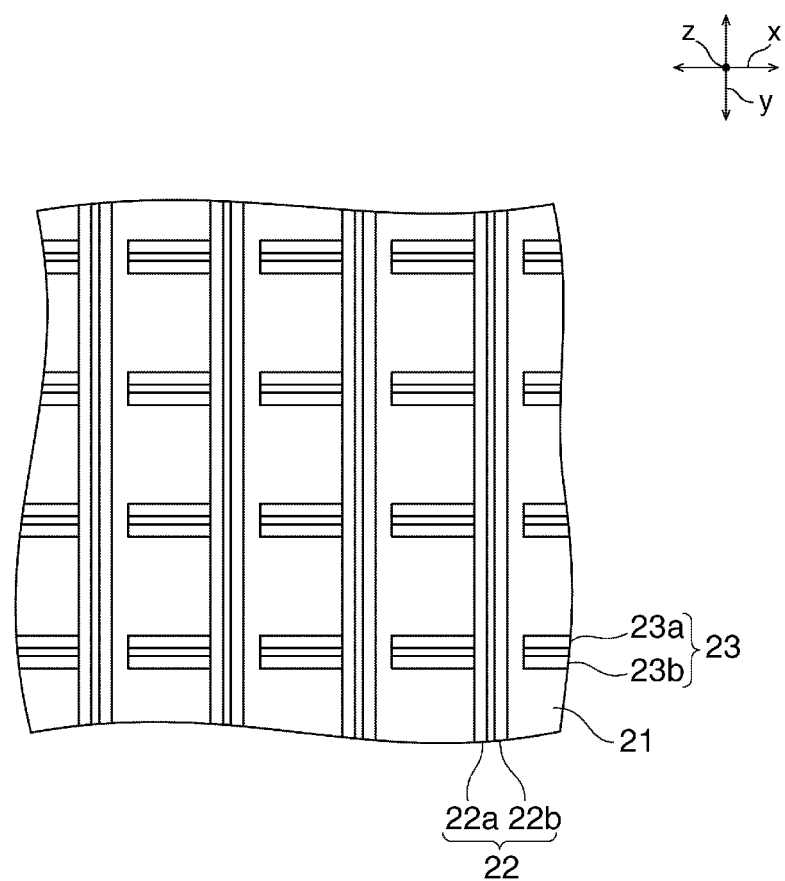
FIG. 8 is a schematic plan view for illustrating a step for producing a cell for a light-emitting device in a second embodiment.
Figure 9:
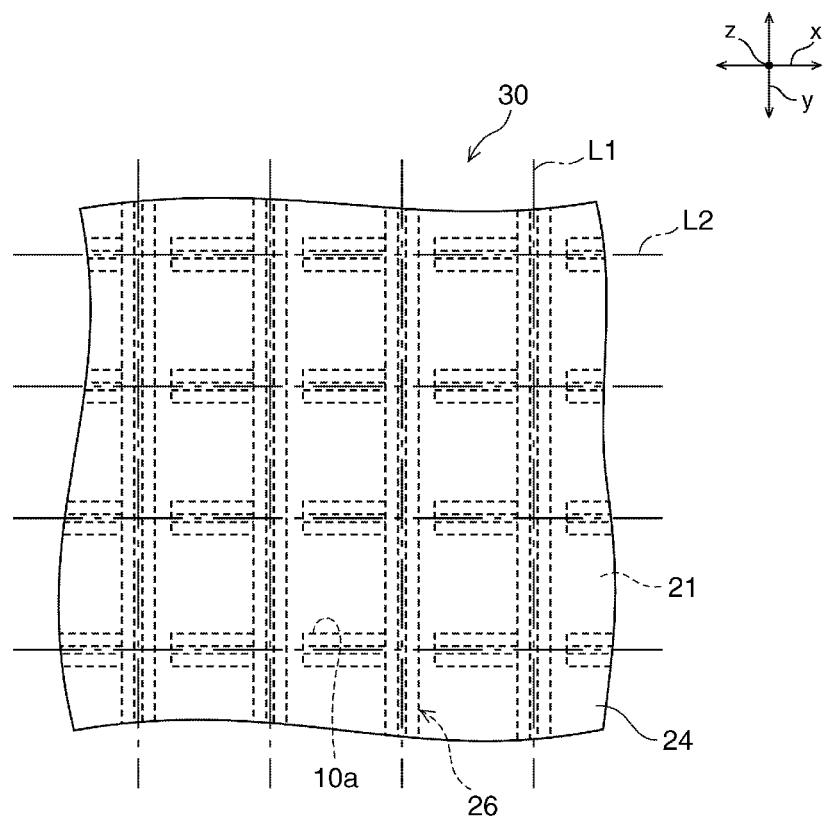
FIG. 9 is a schematic plan view for illustrating another step for producing the cell for a light-emitting device in the second embodiment.

FIG. 8 is a schematic plan view for illustrating a step for producing a cell for a light-emitting device in a second embodiment. FIG. 9 is a schematic plan view for illustrating another step for producing the cell for a light-emitting device in the second embodiment.

In the second embodiment, as shown in FIG. 8, each glass ribbon 22 is formed of two glass ribbons 22a and 22b disposed with a space therebetween in a direction xy. Furthermore, each glass paste layer 23 is formed of two glass paste layers 23a and 23b formed with a space therebetween in a direction yx.

Therefore, as shown in FIG. 9, no glass exists in the middle of the fused part forming element 25. In this embodiment, the cell base material 30 is cut along cutting lines L1 and L2 passing through the middle of the fused part forming element 25 where no glass exists. Therefore, the cell base material 30 can be easily cut. Hence, the cell 10 and thus the light-emitting device 1 can be easily produced.

The cutting of the cell base material 30 in this embodiment can be suitably implemented by dicing.

REFERENCE SIGNS LIST

1 . . . light-emitting device
10 . . . cell
10a . . . internal space
10b . . . communication hole
11 . . . luminescent material
12, 13 . . . glass sheet
14 . . . fused part
15 . . . sealing member
21, 24 . . . glass sheet base material
22, 22a, 22b . . . glass ribbon
23, 23a, 23b . . . glass paste layer
25 . . . fused part forming element
26 . . . fused part
30 . . . cell base material
L1, L2 . . . cutting line

The invention claimed is:

1. A method for producing a cell for a light-emitting device including a pair of glass sheets disposed facing each other with a space therebetween and a glass-made fused part disposed between respective peripheral portions of the pair of glass sheets and fused to each of the pair of glass sheets, the method comprising the steps of:

providing a glass-made fused part forming element in a grid pattern between a pair of glass sheet base materials disposed facing each other with a space therebetween;

fusing the fused part forming element to each of the pair of glass sheet base materials to produce a cell base material having a grid fused part; and cutting the cell base material along each of row and column directions of the grid fused part to produce a plurality of light-emitting devices, wherein portions of the grid fused part forming element extending along a first direction are formed of glass ribbons and portions of the grid fused part forming element extending along a second direction are formed of glass paste.

2. The method for producing a cell for a light-emitting device according to claim 1, wherein the fused part forming element is formed by arranging the glass ribbons along the first direction on one of the pair of glass sheet base materials and applying the glass paste along the second direction on the one glass sheet base material.

3. The method for producing a cell for a light-emitting device according to claim 2, wherein the glass paste is also applied on the glass ribbons.

4. The method for producing a cell for a light-emitting device according to claim 2, wherein the glass paste is kept from being applied on the glass ribbons.

5. A method for producing a light-emitting device, comprising the steps of:

producing a plurality of cells for light-emitting devices by the method for producing a cell for a light-emitting device according to claim 1; and injecting a luminescent material into each of the plurality of cells for light-emitting devices.

6. The method for producing a light-emitting device according to claim 5, wherein an inorganic phosphor is used as the luminescent material.

7. The method for producing a light-emitting device according to claim 6, wherein quantum dot is used as the inorganic phosphor.

* * * * *